（12）United States Patent
Iyechika

(10) Patent No.: US 11,022,428 B2
(45) Date of Patent: Jun. 1, 2021

(54) GROWTH RATE DETECTION APPARATUS, VAPOR DEPOSITION APPARATUS, AND VAPOR DEPOSITION RATE DETECTION METHOD

(71) Applicant: NuFlare Technology, Inc., Yokohama (JP)

(72) Inventor: Yasushi Iyechika, Chiba (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 16/792,938

(22) Filed: Feb. 18, 2020

(65) Prior Publication Data

US 2020/0292299 A1    Sep. 17, 2020

(30) Foreign Application Priority Data

Mar. 14, 2019   (JP) .............................. JP2019-047596

(51) Int. Cl.
| | |
|---|---|
| *G01B 11/06* | (2006.01) |
| *G01N 21/41* | (2006.01) |
| *G01N 21/84* | (2006.01) |

(52) U.S. Cl.
CPC ...... *G01B 11/0633* (2013.01); *G01B 11/0683* (2013.01); *G01N 21/41* (2013.01); *G01N 21/8422* (2013.01); *G01N 2021/4126* (2013.01)

(58) Field of Classification Search
CPC ............ G01B 11/0633; G01B 11/0683; G01N 21/41; G01N 21/8422; G01N 2021/4126
(Continued)

(56) References Cited

U.S. PATENT DOCUMENTS 5,450,205 A    9/1995 Sawin et al.
5,724,145 A    3/1998 Kondo et al.
(Continued)

FOREIGN PATENT DOCUMENTS

JP    8-193813 A    7/1996
JP    8-510838 A    11/1996
(Continued)

OTHER PUBLICATIONS

Breiland et al., "A Virtual Interface Method for Extracting Growth Rates and High Temperature Optical Constants from Thin Semiconductor Films Using In Situ Normal Incidence Reflectance", J. Appl. Phys., 1995, vol. 78, pp. 6726-6736.
(Continued)

*Primary Examiner* — Roy M Punnoose
(74) *Attorney, Agent, or Firm* — Rankin, Hill & Clark LLP

(57) ABSTRACT

A growth rate detection apparatus has a reflectometer to measure reflectivity of a thin film by receiving reflected light of light irradiated with the thin film, a growth rate candidate calculator to calculate a first growth rate and a second growth rate which are candidates for a growth rate of the thin film based on a temporal variation period of the reflectivity and a refractive index of the thin film in a case where the reflectometer irradiates the thin film with light of a first wavelength and to calculate a third growth rate and a fourth growth rate which are candidates for the growth rate of the thin film based on the temporal variation period and the refractive index in a case where the reflectometer irradiates the thin film with light of a second wavelength, and a growth rate selector to select a common growth rate.

18 Claims, 10 Drawing Sheets

(58) Field of Classification Search
USPC .......................................................... 356/630
See application file for complete search history.

(56) References Cited

U.S. PATENT DOCUMENTS

| | | | |
|---|---|---|---|
| 8,138,105 B2* | 3/2012 | Timans | H01L 21/67115 |
| | | | 438/799 |
| 8,815,717 B2 | 8/2014 | Harada et al. | |
| 2010/0099268 A1* | 4/2010 | Timans | H01L 21/67115 |
| | | | 438/761 |
| 2012/0208377 A1* | 8/2012 | Timans | H01L 21/67115 |
| | | | 438/799 |
| 2018/0224268 A1 | 8/2018 | Iyechika | |
| 2018/0292315 A1 | 10/2018 | Iyechika | |

FOREIGN PATENT DOCUMENTS

| | | |
|---|---|---|
| JP | 9-33223 A | 2/1997 |
| JP | 2001-214266 A | 8/2001 |
| JP | 5050044 B2 | 10/2012 |
| JP | 2017-143241 A | 8/2017 |
| JP | 2018-181965 A | 11/2018 |
| WO | 94/28376 A1 | 12/1994 |
| WO | 2017/061333 A1 | 4/2017 |

OTHER PUBLICATIONS

Reentila et al., "In Situ Determination of InGaAs and GaAsN Composition in Multiquantum-Well Structures", Journal of Applied Physics, 2007, vol. 101, pp. 033533-1 to 033533-5.

Na, et al., "In-Situ, Real-Time Spectral Reflectance Monitoring of GaN Growth", Journal of the Korean Physical Society, Dec. 2000, vol. 37, No. 6, pp. 971-974.

* cited by examiner

GROWTH RATE DETECTION APPARATUS, VAPOR DEPOSITION APPARATUS, AND VAPOR DEPOSITION RATE DETECTION METHOD

CROSS REFERENCE TO RELATED APPLICATIONS

This application is based upon and claims the benefit of priority from the prior Japanese Patent Application No. 2019-47596, filed on Mar. 14, 2019, the entire contents of which are incorporated herein by reference.

FIELD

Embodiments relate to a growth rate detection apparatus, a vapor deposition apparatus, and a vapor deposition rate detection method.

BACKGROUND

As methods for forming a uniform thin film over a wide area with excellent reproducibility, vapor deposition methods that form films from vapor phase, such as metal organic chemical vapor deposition (MOCVD), molecular beam epitaxy (MBE), and sputtering, are well known. These methods are important as an industrial thin-film forming method. There has been proposed a method for in-situ observation of the optical constant, growth rate, and the like of a thin film formed by these vapor deposition methods (see Patent Documents 1 to 3).

If the growth rate of the thin film is observed, while a thin film is being formed by the vapor deposition method, the thin film deposition conditions can be adjusted during film formation, and a thin film with a desired film thickness and film quality can be formed with a higher possibility. In order to obtain the growth rate of the thin film, for example, a method is proposed in which the reflectivity of the thin film at a wavelength is measured with a reflectometer during the film formation, the modeled reflectivity function is fitted to the reflectivity measured during the film formation, and the growth rate is calculated from the results of the fitting.

However, when the growth rate is calculated from the results of the fitting, in some cases, multiple solutions are obtained as candidates for the growth rate, and it is not easy to determine which solution is the true growth rate.

DETAILED DESCRIPTION

According to one embodiment, a growth rate detection apparatus includes:

a reflectometer to measure reflectivity of a thin film by receiving reflected light of light irradiated with the thin film formed on a substrate;

a growth rate candidate calculator to calculate a first growth rate and a second growth rate which are candidates for a growth rate of the thin film on a basis of a temporal variation period of the reflectivity and a refractive index of the thin film in a case where the reflectometer irradiates the thin film with light of a first wavelength and to calculate a third growth rate and a fourth growth rate which are candidates for the growth rate of the thin film on a basis of the temporal variation period and the refractive index in a case where the reflectometer irradiates the thin film with light of a second wavelength; and a growth rate selector to select a common growth rate in any one of the first growth rate and the second growth rate and any one of the third growth rate and the fourth growth rate as the growth rate of the thin film.

Figure 1:
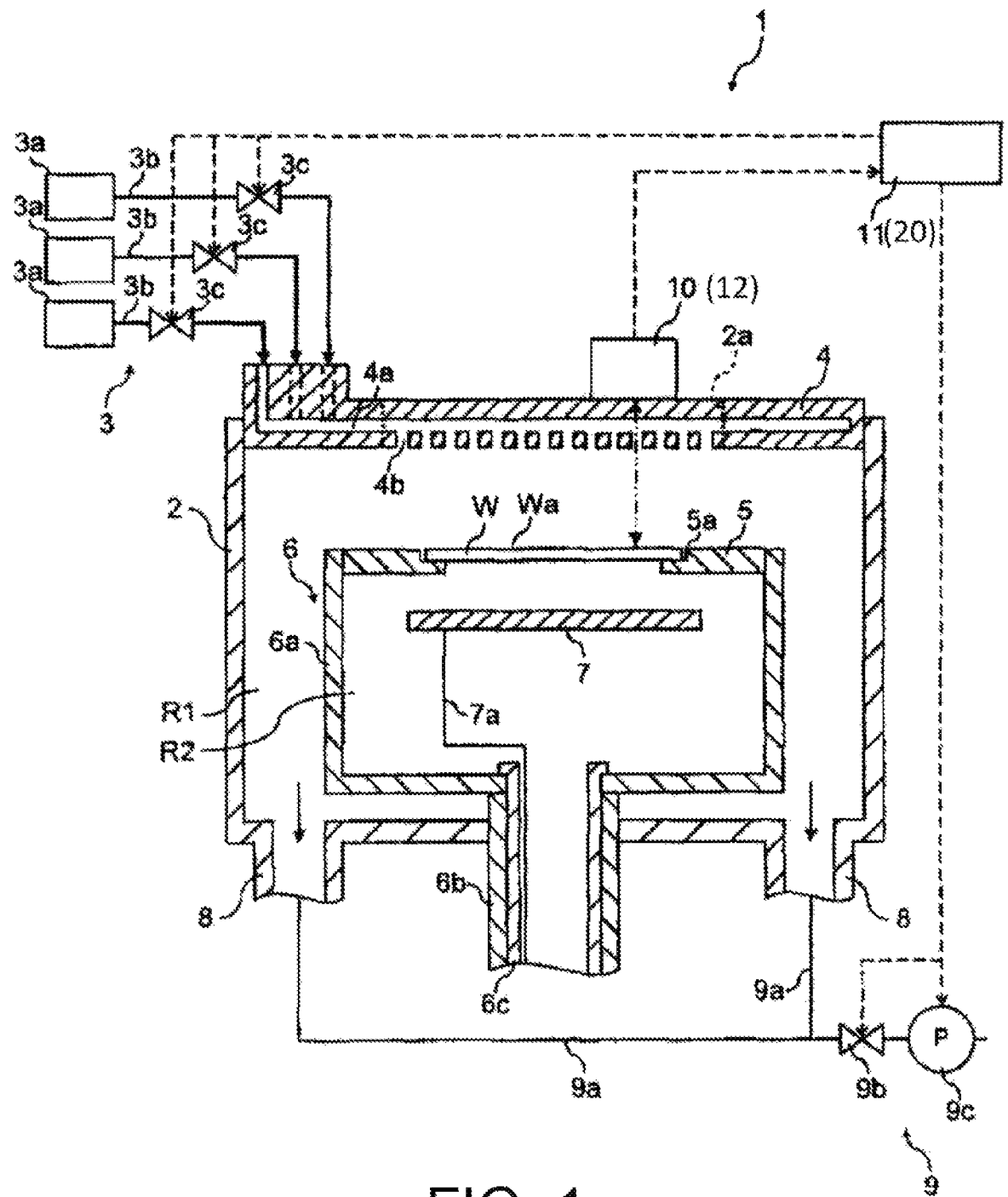
FIG. 1 is a drawing schematically showing a configuration of a vapor deposition apparatus 1 according to one embodiment.

FIG. 1 is a drawing schematically showing a configuration of a vapor deposition apparatus 1 according to a first embodiment. In the present embodiment, an example will be explained in which, as a substrate to be subjected to film formation, a silicon substrate, specifically, a silicon wafer (merely referred to as a wafer, hereinafter) W is used, and a single film or a plurality of thin films are laminated on the wafer W in film formation. Hereinafter, an explanation will be made with MOCVD as an example of a vapor deposition method. Although the present embodiment is applicable to substrates other than the silicon substrate, the substrate surface is required to be a mirror surface. Moreover, as the method of forming a thin film on the substrate surface, not only MOCVD, but other methods can be used.

The vapor deposition apparatus 1 of FIG. 1 is provided with a chamber 2 for film formation on the wafer W, a gas supplier 3 for supplying a source gas to the wafer W in the chamber 2, a source discharger 4 located above the chamber 2, a susceptor 5 for holding the wafer W in the chamber 2, a rotating part 6 that rotates while holding the susceptor 5, a heater 7 for heating the wafer W, a gas exhauster 8 for exhausting a gas in the chamber 2, an exhaust mechanism 9 for exhausting a gas from the gas exhauster 8, a radiation thermometer 10 for measuring a temperature of the wafer W, and a controller 11 for controlling the component parts.

The chamber 2 has a shape (such as a cylindrical shape) capable of accommodating the wafer W to be subjected to film formation. The chamber 2 accommodates the susceptor 5, the heater 7, part of the rotating part 6, etc.

The gas supplier 3 has a plurality of gas storages 3a for respectively storing a plurality of gases, a plurality of gas pipes 3b for connecting the gas storages 3a and the source discharger 4, and a plurality of gas valves 3*c* for adjusting flow rates of gases that flow through the gas pipes 3 *b*. Each gas valve 3*c* is connected to the associated gas pipe 3*b*. The gas valves 3*c* are controlled by the controller 11. There are a plurality of configurations for actual piping, such as, coupling a plurality of gas pipes, making one gas pipe to branch to a plurality of gas pipes, and a combination of gas-pipe branching and coupling.

Source gases supplied from the gas supplier 3 pass through the source discharger 4 and are discharged into the chamber 2. The source gases (process gases) discharged into the chamber 2 are supplied onto the wafer W, and, accordingly, a desired film is formed on the wafer W. There is no particular limitation on the types of source gases to be used.

A shower plate 4*a* is provided on the bottom side of the source discharger 4. The shower plate 4*a* can be configured with a metal material such as stainless steel and an aluminum alloy. Gases from the gas pipes 3*b* are mixed one another in the source discharger 4 and pass through gas jetting ports 4*b* of the shower plate 4*a*, and then are supplied into the chamber 2. A plurality of gas passages may be provided to the shower plate 4*a* so as to supply a plurality of types of gases, as being separated from one another, to the wafer W in the chamber 2.

The structure of the source discharger 4 should be selected in view of uniformity of a formed film, material efficiency, reproducibility, production cost, etc. However, there is no particular limitation on the structure, as long as the selected one meets those requirements. Known structures can also be used as required.

The susceptor 5 is provided on the rotating part 6 to hold the wafer W in such a manner that the wafer W is placed in a counterbore provided in the inner peripheral side of the susceptor 5. In the example of FIG. 1, the susceptor 5 is formed into an annular shape with an opening at its center, however, may be formed into a roughly flat shape without the opening.

The heater 7 is a heating unit that heats the susceptor 5 and/or the wafer W. There is no particular limitation as long as it satisfies requirements such as the ability to heat the object to be heated to a desired temperature and temperature distribution, and durability. As examples, specifically, resistance heating, lamp heating, induction heating, etc. are listed up.

The exhaust mechanism 9 exhausts a reacted source gas from the inside of the chamber 2 via the gas exhauster 8 and controls the pressure inside the chamber 2 to a desired pressure with the operations of an exhaust valve 9*b* and a vacuum pump 9*c*.

The radiation thermometer 10 is provided on the upper surface of the source discharger 4. The radiation thermometer 10 irradiates the wafer W with light from a light source and receives reflected light from the wafer W to measure a reflected light intensity of the wafer W. As described, the radiation thermometer 10 functions as a reflectometer 12 to measure reflectivity of a film growing surface. Moreover, the radiation thermometer 10 receives thermal radiation light from a film growing surface Wa of the wafer W to measure a thermal radiation light intensity. The radiation thermometer 10 has a data arithmetic unit therein. This data arithmetic unit obtains the temperature of the wafer W from the thermal radiation light intensity and the reflectivity. The data arithmetic unit can be configured, for example, with a general purpose computer.

A light transmission window 2*a* is provided on the upper surface of the source discharger 4. Light from a light source of the radiation thermometer 10, and reflected light and thermal radiation light each from the wafer W pass through the light transmission window 2*a*. The light transmission window 2*a* may be formed into any shape such as a slit shape, a rectangular shape, and a circular shape. A member used for the window is transparent in a wavelength range of light to be measured by the radiation thermometer 10. In the case of measuring the temperature from a room temperature to about 1500° C., it is preferable to measure a wavelength of light in the range from a visible range to a near infrared range. In this case, as a window member, quartz glass is preferably used.

The controller 11 is provided with a computer for centralized control of component parts of the vapor deposition apparatus 1 and a storage unit for storing film formation information related to film formation, a several types of programs, etc. Based on the film formation information, the several types of programs, etc., the controller 11 controls the gas supplier 3, the rotation mechanism of the rotating part 6, the exhaust mechanism 9, etc. to control the heating of the wafer W by the heater 7, and the like. In addition, the controller 11 has a function of a growth rate detection apparatus 20 according to the present embodiment. The growth rate detection apparatus 20 may be provided in the vapor deposition apparatus 1 of FIG. 1, apart from the controller 11. In this case, the growth rate detection apparatus 20 is connected to the controller 11. The internal configuration and operation of the growth rate detection apparatus 20 will be described later.

Figure 2:
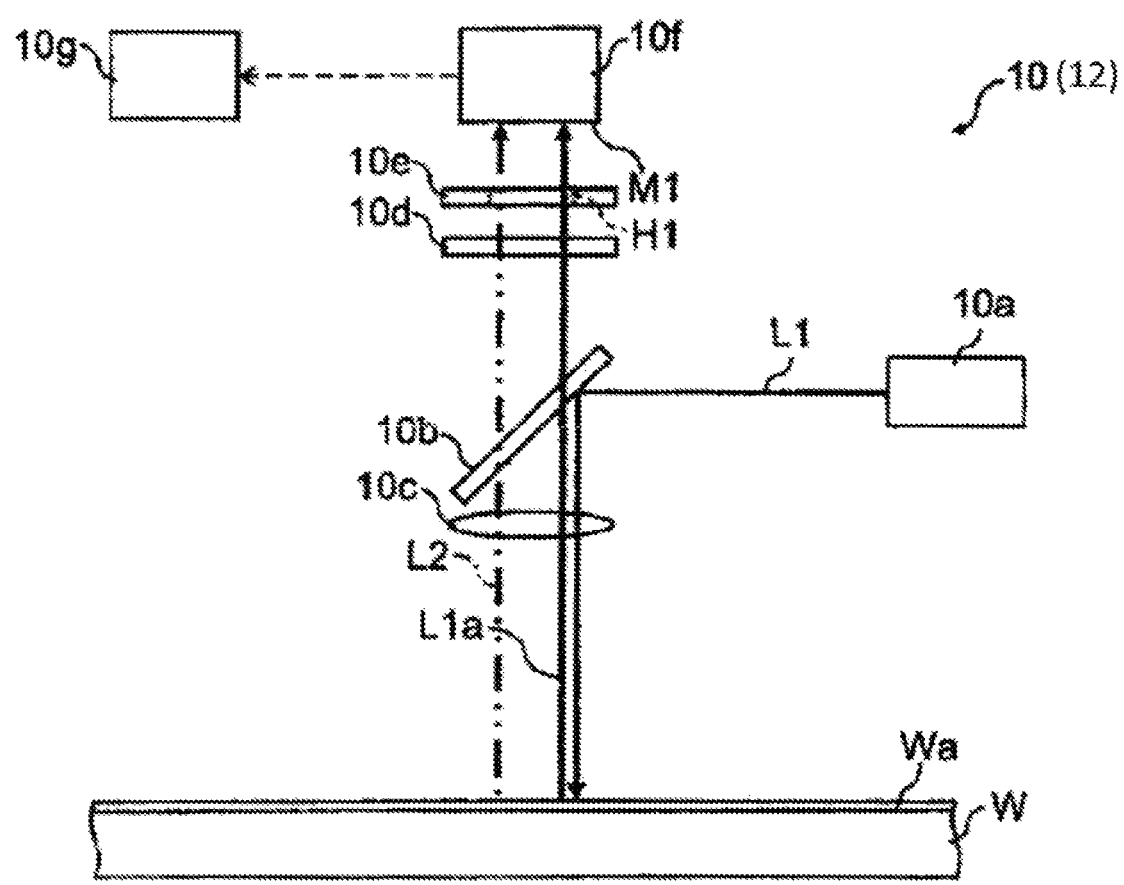
FIG. 2 is a drawing showing an internal configuration of a radiation thermometer.

FIG. 2 is a drawing showing an internal configuration of the radiation thermometer 10. The radiation thermometer 10 has a light source 10*a*, a half mirror 10*b*, a focus adjustment lens 10*c*, a wavelength selective filter 10*d*, a diaphragm 10*e*, a photoreceptor 10*f*, and a thermometer controller 10*g*.

The light source 10*a* emits illumination light L1 with which the wafer W is irradiated. The half mirror 10*b* reflects and directs the illumination light L1 to the wafer W, and passes light from the wafer W therethrough. The focus adjustment lens 10*c* makes the illumination light L1, which has passed through the half mirror 10*b*, focused on the wafer W. Furthermore, the focus adjustment lens 10*c* makes reflected light L1*a* and thermal radiation light L2 from the wafer W focused on a photoreception surface M1 of the photoreceptor 10*f*. The wavelength selective filter 10*d* passes therethrough reflected light L1*a* and thermal radiation light L2 that have passed through the half mirror 10*b*, in a predetermined wavelength range. The diaphragm 10*e* passes therethrough light only from a portion of the wafer W, the portion being required for measurements. The photoreceptor 10*f* receives the reflected light L1*a* and thermal radiation light L2 that have passed through the diaphragm 10*e*. The thermometer controller 10*g* obtains the temperature of the wafer W based on the intensity of the reflected light L1*a* (reflected light intensity) and the intensity of the thermal radiation light L2 (thermal radiation light intensity), received by the photoreceptor 10*f*.

The radiation thermometer 10 irradiates a measurement target with light in a relatively wide wavelength range and observes reflected light in a predetermined wavelength range using a wavelength selective filter. This is because the thermal radiation intensity is also required to be measured in the predetermined wavelength. On the contrary, when only the reflectivity is obtained, a method of irradiating a measurement target with light of a predetermined wavelength to measure its reflected light intensity can be used. The above-described light of a predetermined wavelength can be acquired by passing light of a relatively wide wavelength range through a wavelength selective filter which passes only light of a predetermined wavelength therethrough. Or light from a light source of high mono chromaticity, such as a laser beam, may be used.

The reflectivity measured by the radiation thermometer 10 can be used as measured data of reflectivity in the present embodiment. Moreover, a dedicated reflectivity measuring apparatus to be used in the present embodiment may be provided to a vapor deposition apparatus. In addition, as an apparatus for measuring substrate warpage, an apparatus that irradiates a substrate with light of high directivity such as a laser beam is generally used. Such a warpage measuring apparatus can measure a reflected light intensity while observing the warpage. Reflectivity data measured by such a warpage measuring apparatus can also be used as measured reflectivity data in the present embodiment.

The vapor deposition apparatus 1 according to the present embodiment can be used for formation of a variety of films on the wafer W. However, hereinafter, as an example, growth rate measurements in the case where an AlN layer is formed on a silicon wafer W, will be explained.

(Description of One Comparative Example)

First, a comparative example of the growth rate detection apparatus 20 according to the present embodiment will be described. In a process of forming one or a plurality of thin films on a substrate surface that is a mirror surface, when a thin film surface is irradiated with light of a given wavelength, reflected light from the thin film surface and reflected light from the substrate surface interfere with each other, so that the reflectivity of interference light changes periodically according to the thickness of the thin film to be formed. The reflectivity change cycle depends on the wavelength of light with which the thin film is irradiated. More specifically, the reflectivity changes with the film thickness represented by $T=\lambda/2n$ as a period. n is the refractive index of the thin film, and $\lambda$ is the wavelength of the irradiated light.

Figure 3:
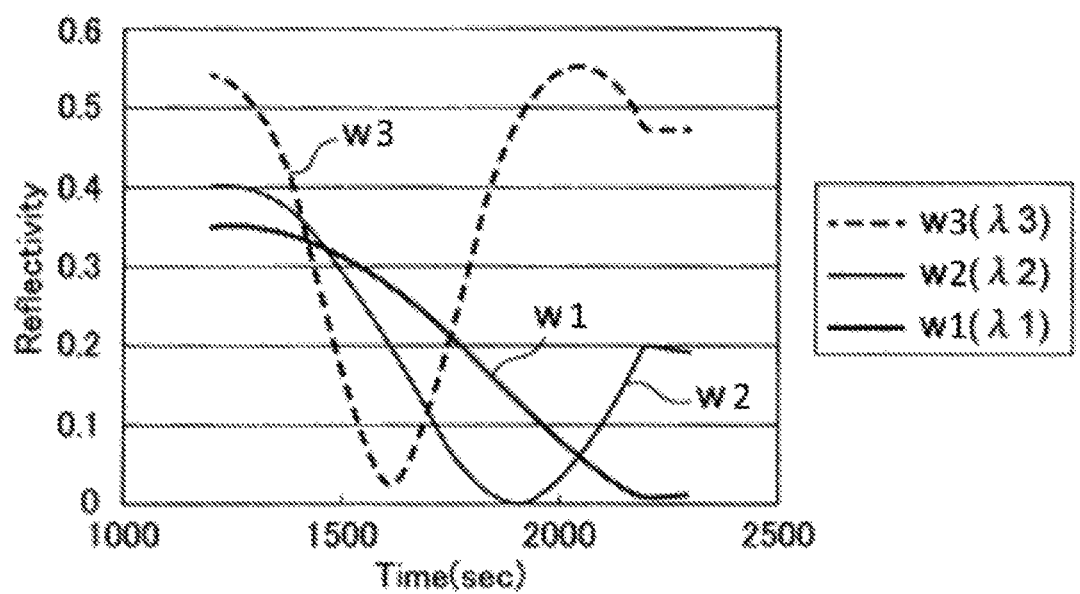
FIG. 3 is a waveform diagram showing change in reflectivity of interference light with time.

FIG. 3 is a waveform diagram showing change in reflectivity of interference light with time. In FIG. 3, the abscissa is time and the ordinate is reflectivity. FIG. 3 shows three reflectivity waveforms w1 to w3 corresponding to pieces of light of three wavelengths with which the thin film surface of the AlN layer are irradiated. In this example, w2 has a shorter wavelength than w1, and w3 has a shorter wavelength than w2. As understood from FIG. 3, as the wavelength is longer, the reflectivity shows a moderate change with time.

Figure 4:
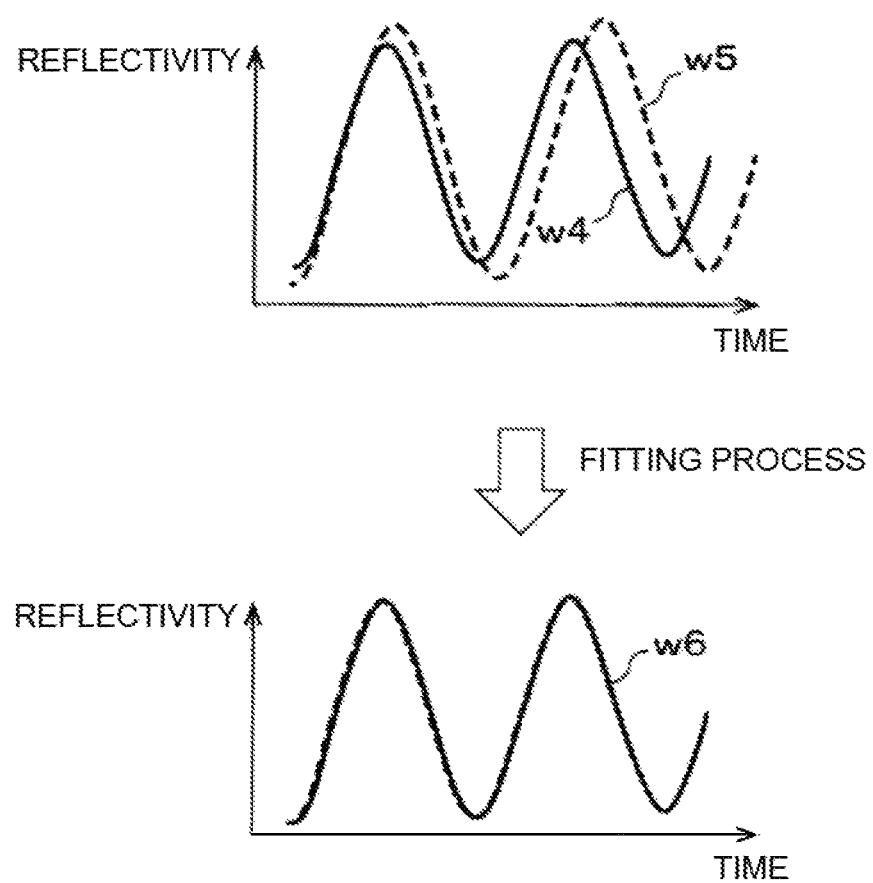
FIG. 4 is a drawing showing the outline of a process performed by a growth rate detection apparatus according to one comparative example.

FIG. 4 is a drawing showing the outline of a process performed by the growth rate detection apparatus 20 according to one comparative example. The growth rate detection apparatus 20 according to one comparative example performs a process of fitting the reflectivity model function to the reflectivity actual measurement curve, and calculates the growth rate using the fitted reflectivity model function.

In FIG. 4, a waveform w4 is a reflectivity change with time measured by the reflectometer 12 and a waveform w5 is a reflectivity change with time acquired by simulation (reflectivity model function). In FIG. 4, the abscissa is time and the ordinate is reflectivity. In one comparative example, a process of matching the waveform w5 with the waveform w4 (hereinafter, referred to as fitting) is performed by adjusting a set of values of fitting parameters (simply referred to as fitting parameter(s) or the like, hereinafter) of the reflectivity model function. A waveform w6 is an example of fitting the waveform w5 to the waveform w4.

Figure 5:
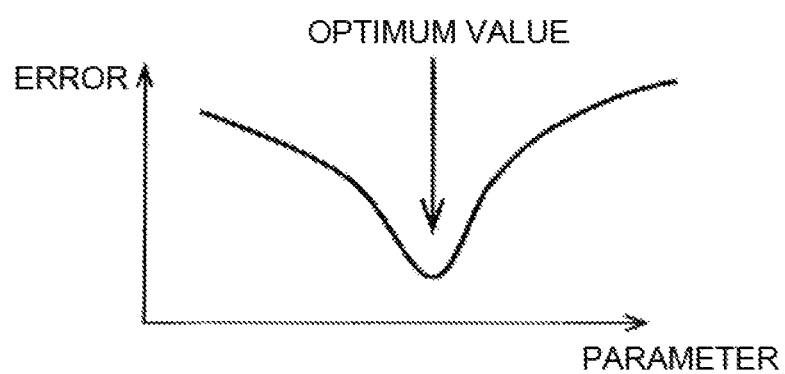
FIG. 5 is a diagram schematically showing dependence of the error between a reflectivity model function and reflectivity measured by a reflectometer on a parameter.

As a result of above, as shown in FIG. 5, an error between the reflectivity model function and the reflectivity measured by the reflectometer 12 becomes minimum at the best fitting, the minimum point being referred to as an optimum value.

The horizontal axis in FIG. 5 is the value of the fitting parameter, and the vertical axis is the error. Although FIG. 5 shows just one parameter used in fitting for simplicity, actually many parameters are used in fitting, and the above-mentioned error is a multidimensional function of these parameters.

Figure 6:
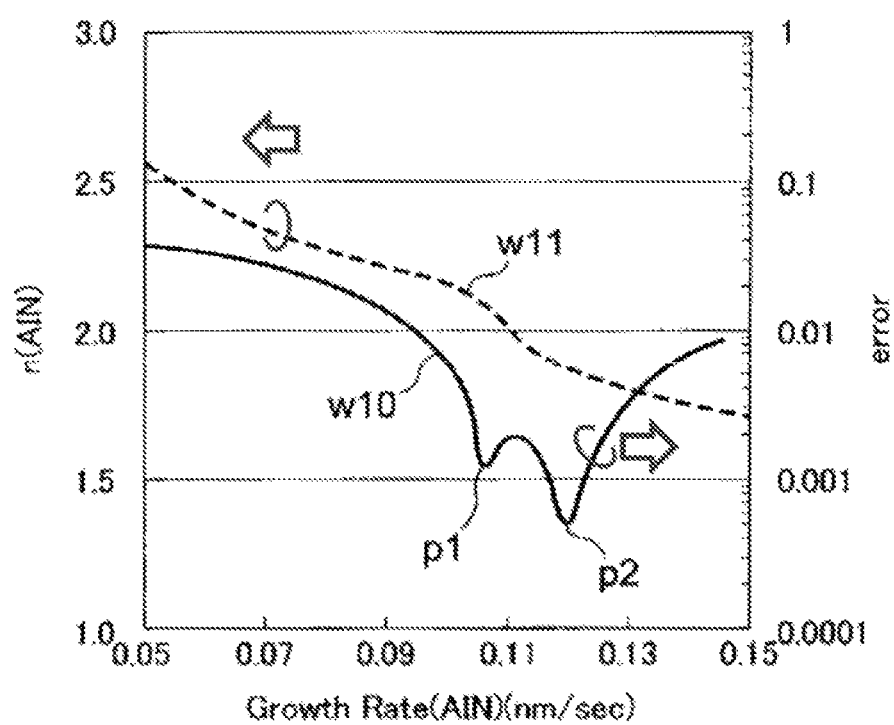
FIG. 6 is a graph showing a relationship of an error between measured reflectivity and fitted model function, and a refractive index obtained by the fitting with the growth rate.

FIG. 6 shows a relationship of an error, in the case of fitting the reflectivity model function to the measured values of reflectivity of the AlN layer at the wavelength $\lambda 1$ shown in FIG. 3, and also a relationship of a refractive index acquired by the fitting, to the growth rate (curves w10 and w11, respectively).

The abscissa and ordinate for the error curve w10 are a growth rate (nm/sec) of the AlN layer and an error amount, respectively. The abscissa and ordinate for the refractive index curve wll are the growth rate (nm/sec) of the AlN layer and a refractive index n, respectively.

A calculation method of the error and refractive index shown in FIG. 6 will be explained hereinafter. In the case of growing the AlN layer shown in FIG. 3, the reflectivity change with time is expressed by four parameters that are real part and imaginary part of a complex refractive index of a substrate on which the AlN layer is grown, and refractive index and growth rate of AlN. Although, usually, fitting is performed simultaneously to the four parameters, in order to make clear the relationships between a fitting error and the growth rate, and between a refractive index acquired by fitting and the growth rate, the growth rate among the four fitting parameters is fixed to a certain value and fitting is performed to the other three parameters. In this way, it is determined to what level, the error decreases at a certain growth rate and then the acquired value of refractive index in the case. FIG. 6 shows the error and the refractive index plotted with respect to the growth rate, which were acquired by the above-described procedure performed to a large number of growth rate values. In FIG. 6, minimum points p1 and p2 on the error curve w10 are expected to give the same result with the minimum points in the case of fitting the four parameters simultaneously.

The above-described complex refractive index of the substrate is virtual. In detail, it is known that the reflectivity change, in the case where a thin film is further formed on a single-layer film or a multi-layer film, is equivalent to the reflectivity change in the case where a layer under a formed thin film is a single layer having a virtual complex refractive index. As described, a reflectivity calculation method, in the case where a layer, on which a thin film is formed, is treated as a single layer having a virtual complex refractive index, is referred to as a virtual interface method or the like.

In the errors on the error curve w10, there are two minimum points p1 and p2. The minimum points p1 and p2 indicate growth rates in the case where fitting between reflectivity calculated with a reflectivity model function and reflectivity measured by the reflectometer 12 is most appropriate. Although in the minimum points p1 and p2, either one is considered to correspond to an actual growth rate, in view of errors included in reflectivity measurements, it cannot be determined in principle only from a result of FIG. 6 which of p1 and p2 is a correct solution.

It is seen in FIG. 6 that AlN refractive index takes different values at the two minimum points p1 and p2. At the minimum point p2 where the growth rate is much higher, the refractive index is below 2.0 that is lower than an actual AlN-layer refractive index. It is therefore found that the minimum point p2 is not a correct solution for estimating an AlN-layer growth rate, and it can be estimated that the growth rate at the minimum point p1 is a correct solution.

Figure 7:
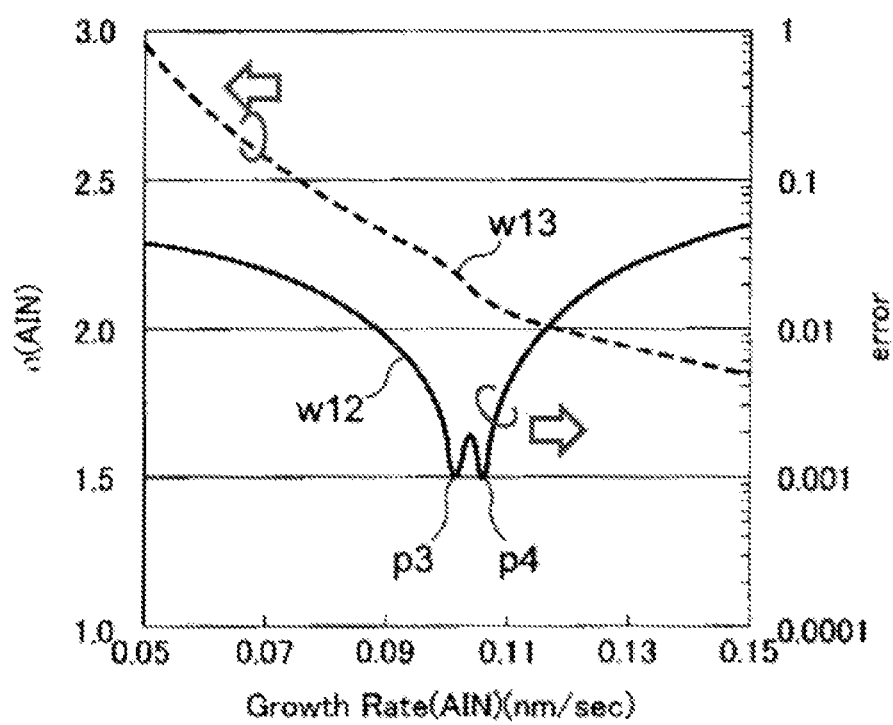
FIG. 7 is a graph showing a relationship of an error between measured reflectivity and fitted model function, and a refractive index obtained by the fitting with the growth rate where reflectivity was measured at a different wavelength from that of FIG. 6.

FIG. 7 shows an error curve w12 of an error in the case of fitting performed with light of the wavelength λ2 different from that in FIG. 6 and a refractive index curve w13 obtained by fitting. Also in FIG. 7, there are two minimum points p3 and p4 in the error curve w12. However, the refractive indexes at the minimum points p3 and p4 both exceed 2.0, so that it cannot be determined only from FIG. 7 which of the minimum points p3 and p4 is a correct solution.

In this way, when the growth rate is calculated on the basis of the reflectivity model function fitted to the reflectivity actual measurement curve, multiple solutions are obtained, and it is not easy to grasp which solution represents the true growth rate. Therefore, in the present embodiment, the growth rate is calculated by calculation from the maximum value and the minimum value of the reflectivity measured by the reflectometer 12, without performing the process of fitting the reflectivity model function to the reflectivity actual measurement curve. In the present embodiment, the true growth rate of the thin film is identified among the growth rates obtained from reflectivity curves for different wavelengths of light used for the reflectivity measurement.

(Basic Principle of Present Embodiment)

Figure 8:
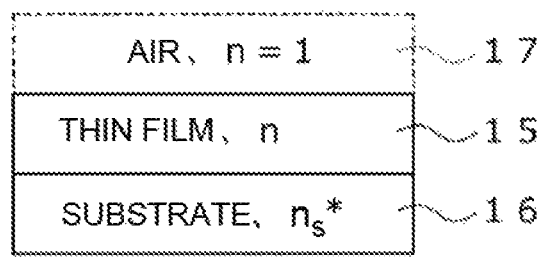
FIG. 8 is a diagram schematically showing a cross-sectional structure of a thin film formed on a substrate.

FIG. 8 is a diagram schematically showing a cross-sectional structure of a thin film 15 formed on a substrate. In FIG. 8, the refractive index of the substrate 16 is $n_s^*$, the refractive index of the thin film 15 is n, the refractive index of air 17 (the refractive index of the space on the thin film) is 1, the film thickness of the thin film 15 is d, and the wavelength of light emitted from the reflectometer 12 is λ. Further, it is assumed that the refractive index n of the thin film 15 is constant inside the thin film 15. In FIG. 8, the thin film 15 is transparent to light having the wavelength λ, and therefore the refractive index thereof is a real number. On the other hand, since the phase of the reflected light generally changes in the reflection of light at the interface between the substrate 16 and the thin film 15, the refractive index $n_s^*$ of the substrate 16 is represented by a complex number. A part of the light incident on the thin film 15 is reflected at the interface between the thin film 15 and the air 17. Further, the remaining light propagates inside the thin film 15 and is reflected at the interface between the substrate 16 and the thin film 15. A part of the light reflected at the interface between the substrate 16 and the thin film 15 is emitted from the thin film 15, and the remaining part of the light is reflected at the interface between the thin film 15 and the air 17.

The air described above may actually be a vacuum or a gas in a growth atmosphere. Vacuum and gases such as air have a refractive index of approximately 1, and they are not necessarily distinguished in the following description. In this specification, the air in contact with the thin film formed on the substrate includes a vacuum or a gas in a growth atmosphere.

As described above, the light reflected by the laminated structure of the air 17, the thin film 15, and the substrate 16 is the total amount of light that has traveled 0 or more times inside the thin film 15. As described below, this can be expressed by using an electric field reflectivity $r_0$ at the interface between the air 17 and the thin film 15 and an electric field reflectivity $r_1$ at the interface between the thin film 15 and the substrate 16. That is, the electric field reflectivity $r_0$ at the interface between the air 17 and the thin film 15 is expressed by the following Equation (1).

$$r_0 = \frac{n-1}{n+1} \quad (1)$$

The electric field reflectivity $r_1$ at the interface between the thin film 15 and the substrate 16 is expressed by the following Equation (2).

$$r_1 = \rho \cdot \exp(i\beta) = \frac{n_s^* - n}{n_s^* + n} = \frac{n_s + ik_s - n}{n_s + ik_s + n} \quad (2)$$

In Equation (2), ρ on the right side is an absolute value of the refractive index $r_1$ of the substrate 16, $n_s$ is the real component of the refractive index of the substrate 16, and $k_s$ is the absorption coefficient of the substrate 16.

The actual reflected light from the thin film 15 is the reflected light at the interface between the air 17 and the thin film 15 and all the light that passes through the interface between the thin film 15 and the air 17 and returns to the air 17 side after being incident on the thin film 15 from the air 17 and reciprocating between the interface on the substrate 16 side of the thin film 15 and the interface on the air 17 side p times (p is an integer of 1 or more). Further, when the light passes through the thin film 15, the phase changes. Thus, when this change in phase is taken into consideration, the electric field $E_r$ of the reflected light is expressed by the following Equation (3).

$$\begin{aligned} E_r &= E_0 r_0 + E_0(1-r_0^2)r_1 \cdot \exp(i2\varphi) \\ &\quad \{1 - r_1 r_0 \cdot \exp(i2\varphi) + (-r_1 r_0)2\exp(i4\varphi) + \ldots\} \\ &= E_0 r_0 + E_0(1-r_0^2)r_1 \cdot \exp(i2\varphi) / \\ &\quad \{1 + r_1 r_0 \cdot \exp(i2\varphi)\} \\ &= E_0\{r_0 + r_1 \cdot \exp(i2\varphi)\} / \\ &\quad \{1 + r_1 r_0 \cdot \exp(i2\varphi)\} \end{aligned} \quad (3)$$

$E_0$ in the Equation (3) is an electric field of light with which the thin film 15 is irradiated. Therefore, the electric field reflectivity r of the thin film 15 is expressed by the following Equation (4).

$$r = E_r/E_0 = \{r_0 + r_1 \cdot \exp(i2\varphi)\}/\{1 + r_1 r_0 \cdot \exp(i2\varphi)\} \quad (4)$$

Here, a phase difference (hereinafter referred to as a phase) φ generated when light passes through the thin film 15 is expressed as the following Equation (5) using the refractive index n of the thin film 15, the film thickness d of the thin film 15, and the wavelength of light λ.

$$\varphi = 2\pi n d/\lambda \quad (5)$$

As shown in Equation (5), the phase φ is proportional to the film thickness d and increases linearly as the film thickness d increases. The observed light reflectivity (energy reflectivity) is proportional to the square of the amplitude of the electric field reflectivity. That is, the electric field reflectivity and energy reflectivity are periodic functions of film thickness. On the other hand, assuming that the film thickness of the thin film 15 is proportional to the growth time, n, $n_s$, $k_s$, and the growth rate (=d/time) used in Equation (4) through Equations (1) and (2) are obtained from the change in reflectivity over time.

The above example is a case where a single film is formed on the substrate 16, but the same method can be used in a case where another thin film 15 is formed after one or more thin films 15 is formed on the substrate 16. In other words, when two or more thin films 15 are formed on the substrate 16, the refractive index and film thickness of the layer closer to the substrate 16 than the outermost layer cannot be determined only by the dependence of the reflectivity on the film thickness of the outermost layer. However, a plurality of layers including the substrate 16 excluding the outermost layer are virtually regarded as the substrate 16 having a refractive index $n_s'$ and an absorption coefficient $k_s'$, and the refractive index and growth rate of the outermost layer can be determined from the dependence of the reflectivity on the film thickness of the outermost layer.

Reflectivity R of the thin film 15 measured by the reflectometer 12 can be expressed by the following Equation (6).

$$R = r \cdot r^* = \frac{r_0 + r_1 \cdot \exp(2i\phi)}{1 + r_0 r_1 \exp(2i\phi)} \times \frac{r_0 + r_1^* \cdot \exp(-2i\phi)}{1 + r_0 r_1^* \cdot \exp(-2i\phi)} \quad (6)$$

Here, defining $\gamma = \beta + 2\varphi$ and $B = \cos \gamma$, Equation (6) becomes Equation (7).

$$R = \frac{r_0^2 + \rho^2 + 2r_0\rho(2\cos\gamma)}{1 + r_0^2\rho^2 + r_0\rho(2\cos\gamma)} = \frac{r_0^2 + \rho^2 + 2r_0\rho B}{1 + r_0^2\rho^2 + 2r_0\rho B} \quad (7)$$

As can be seen from Equation (7), the reflectivity R becomes a maximum value $R_+$ when $B=1$ and becomes a minimum value $R_-$ when $B=-1$. The maximum value $R_+$ of the reflectivity R is expressed by the following Equation (8), and the minimum value $R_-$ is expressed by the following Equation (9).

$$R_+ = \frac{r_0^2 + \rho^2 + 2r_0\rho}{1 + r_0^2\rho^2 + 2r_0\rho} = \frac{(r_0 + \rho)^2}{(1 + r_0\rho)^2} \quad (8)$$

$$R_- = \frac{r_0^2 + \rho^2 - 2r_0\rho}{1 + r_0^2\rho^2 - 2r_0\rho} = \frac{(r_0 - \rho)^2}{(1 - r_0\rho)^2} \quad (9)$$

When Equation (8) is modified, an absolute value $\rho$ of $r_1$ of the substrate 16 is expressed by the following Equation (10).

$$\rho = \frac{\sqrt{R_+} - r_0}{1 - r_0\sqrt{R_+}} \quad (10)$$

Further, when Equation (9) is modified, Equation (11) is obtained.

$$\sqrt{R_-} = \frac{|r_0 - \rho|}{1 - r_0\rho} \quad (11)$$

In Equation (11), when $r_0 > \rho$, the absolute value $\rho$ of $r_1$ of the substrate 16 is expressed by the following Equation (12).

$$\rho = \frac{r_0 - \sqrt{R_-}}{1 - r_0\sqrt{R_-}} \quad (12)$$

From Equations (10) and (12), the equation of $r_0$ shown in the following Equation (13) is obtained.

$$r_0^2 - 2\frac{(1 + \sqrt{R_+ \cdot R_-})}{\sqrt{R_+} + \sqrt{R_-}} r_0 + 1 = 0 \quad (13)$$

From Equation (13), the electric field reflectivity $r_0$ at the interface between the air 17 and the thin film 15 is expressed by the following Equation (14).

$$r_0 = \frac{1}{\sqrt{R_+} + \sqrt{R_-}} \{1 + \sqrt{R_+ \cdot R_-} \pm \sqrt{(1 - R_+)(1 - R_-)}\} \quad (14)$$

Since the reflectivity $r_0$ is less than 1, only the sign "−" is the correct sign of the signs "±" in the braces of the formula (14). Therefore, the reflectivity $r_0$ is expressed by the following Equation (15).

$$r_0 = \frac{1}{\sqrt{R_+} + \sqrt{R_-}} \{1 + \sqrt{R_+ \cdot R_-} - \sqrt{(1 - R_+)(1 - R_-)}\} \quad (15)$$

When the reflectivity $r_0$ obtained by Expression (15) is substituted into Expression (10), for example, the absolute value $\rho$ of $r_1$ of the substrate 16 is expressed by the following Expression (16).

$$\rho = \frac{\sqrt{(1 - R_-)} - \sqrt{(1 - R_+)}}{\sqrt{R_-(1 - R_+)} + \sqrt{R_+(1 - R_-)}} \quad (16)$$

Here, when attention is paid to the right sides of the above-described Equations (8) and (9), it can be seen that $\rho$, absolute value of $r_1$, and $r_0$ can be interchanged. For this reason, $\rho$ and $r_0$ can also be expressed by the following Expressions (17) and (18), respectively. The values $\rho$ and $r_0$ expressed by Equations (17) and (18) correspond to the values in the case of $r_0 \leq \rho$ in Equation (11).

$$r_0 = \frac{\sqrt{(1 - R_-)} - \sqrt{(1 - R_+)}}{\sqrt{R_-(1 - R_+)} + \sqrt{R_+(1 - R_-)}} \quad (17)$$

$$\rho = \frac{1}{\sqrt{R_+} + \sqrt{R_-}} \{1 + \sqrt{R_+ \cdot R_-} - \sqrt{(1 - R_+)(1 - R_-)}\} \quad (18)$$

Thus, by substituting the maximum value $R_+$ and the minimum value $R_-$ of the reflectivity R measured by the reflectometer 12 into Equations (15) and (16), or Equations (17) and (18), $\rho$, absolute value of $r_1$, and $r_{s0}$ can be calculated. If the reflectivity $r_0$ is known, the refractive index n of the thin film 15 can be calculated from Equation (1).

The reflectivity R of the thin film 15 measured by the reflectometer 12 changes periodically with respect to the film thickness of the thin film 15, and this period is inversely proportional to the refractive index n of the thin film 15 and proportional to the measurement wavelength λ. A variation period T with respect to the film thickness of the reflectivity R of the thin film 15 is expressed by the following Equation (19).

$$T = \frac{\lambda}{2n} \quad (19)$$

The growth rate g of the thin film 15 is a value obtained by dividing the film thickness d by a film formation time t, and is represented by the following Equation (20).

$$d = g \times t \quad (20)$$

From the refractive index n of the thin film 15 and the measurement wavelength $\lambda$, the variation period T with respect to the film thickness of the reflectivity is calculated from Equation (19). On the other hand, the time period of the reflectivity, that is, the time during which the thin film 15 grows by T is obtained from the change in reflectivity over time. Therefore, the growth rate g of the thin film 15 can be calculated by dividing T expressed by Equation (19) by the time during which one period of the reflectivity change occurs.

Since the refractive index n is calculated from the reflectivity $r_0$ in Equation (15) and another refractive index n is calculated from the reflectivity $r_0$ in Equation (17), two refractive indexes n are obtained for one wavelength of light used for the reflectivity measurement by the reflectometer 12. Therefore, two growth rates are obtained for one wavelength.

Even when the reflectometer 12 uses light of another wavelength for reflectivity measurement, two refractive indexes n and two growth rates are obtained. However, at any wavelength, one of the two growth rates obtained as described above is the actual growth rate. In other words, even if the measurement wavelength for the change in reflectivity is changed, a plurality of growth rates obtained for each wavelength include the same value. Therefore, the actual growth rate is the growth rate which is not changed when the growth rates are obtained at two or more different wavelengths.

In the present embodiment, the two growth rates at the first wavelength and the two growth rates at the second wavelength are compared, and of the growth rates of both wavelengths, the common growth rate is selected as the growth rate of the thin film 15.

(Specific Configuration of Present Embodiment)

Figure 9:
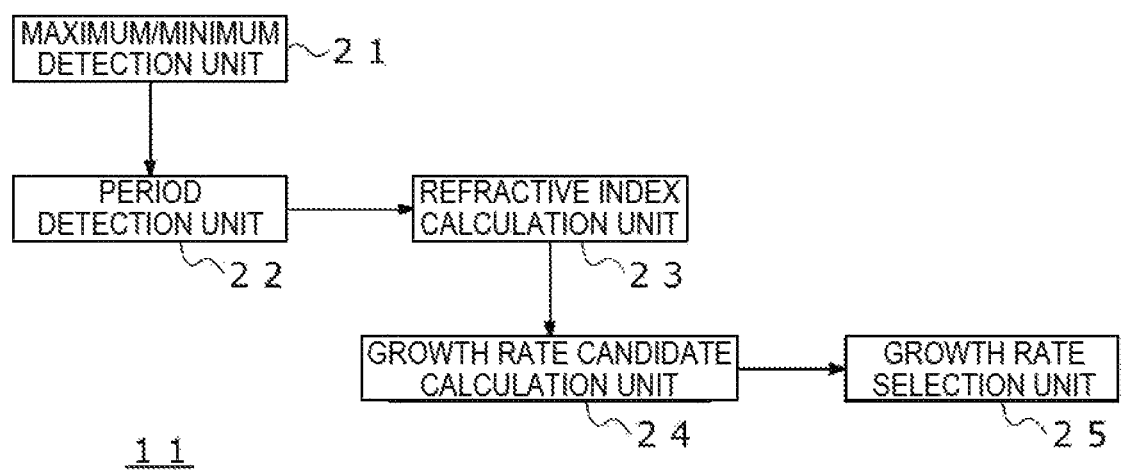
FIG. 9 is a functional block diagram of a controller of FIG. 1.

FIG. 9 is a functional block diagram of the controller 11 of FIG. 1. As shown in FIG. 9, the controller 11 includes a maximum/minimum detection unit 21, a period detection unit 22, a refractive index calculation unit 23, a growth rate candidate calculation unit 24, and a growth rate selection unit 25.

The maximum/minimum detection unit 21 detects the maximum value and the minimum value of the reflectivity measured by the reflectometer 12. The period detection unit 22 detects the temporal variation period of the reflectivity measured by the reflectometer 12.

The maximum/minimum detection unit 21 detects the maximum value and the minimum value of the reflectivity from the peak value of the reflectivity waveform. Further, the period detection unit 22 detects the temporal period of the reflectivity from the length of time corresponding to one period of the reflectivity waveform.

The refractive index calculation unit 23 calculates the refractive index of the thin film 15 on the basis of the maximum value and the minimum value of the reflectivity detected by the maximum/minimum detection unit 21. Here, for example, the reflectivity $r_0$ of the electric field at the interface between the air 17 and the thin film 15 calculated by the above-described Equations (15) to (18) in the reflectivity calculation unit in the controller 11 is input into Equation (1), and the refractive index of the thin film 15 is calculated.

The growth rate candidate calculation unit 24 calculates a first growth rate and a second growth rate which are candidates for the growth rate of the thin film 15 on the basis of the variation period and refractive index with respect to the film thickness when the reflectometer 12 irradiates the thin film 15 with light of the first wavelength and calculates the third growth rate and the fourth growth rate which are candidates for the growth rate of the thin film 15 on the basis of the variation period and the refractive index with respect to the film thickness when the reflectometer 12 irradiates the thin film 15 with light of the second wavelength.

The growth rate selection unit 25 selects a common growth rate as the growth rate of the thin film 15 between one of the first growth rate and the second growth rate and one of the third growth rate and the fourth growth rate.

Figure 10:
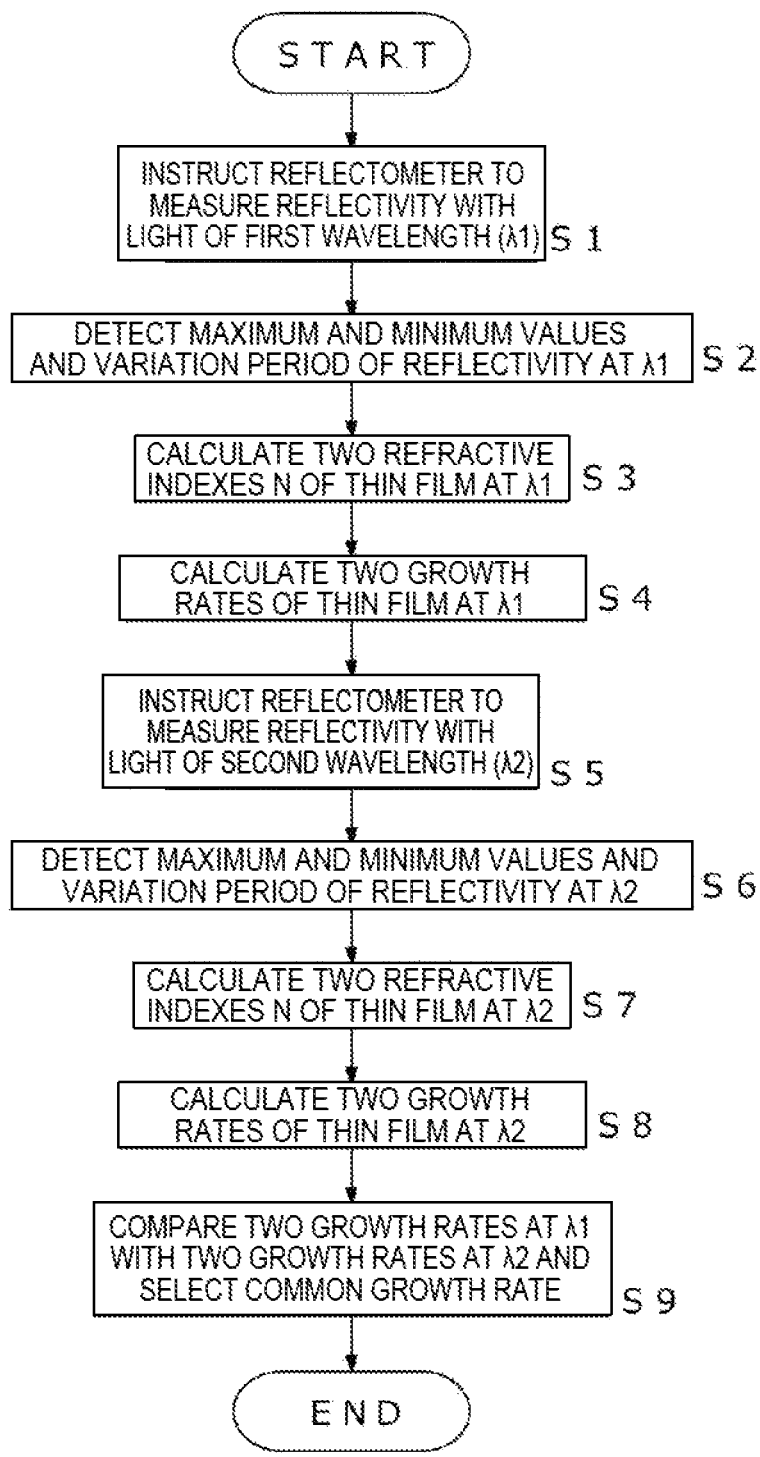
FIG. 10 is a flowchart showing the processing operation of the controller of which detailed configuration is illustrated in FIG. 9.

FIG. 10 is a flowchart showing the processing operation of the controller 11 of which detailed configuration is illustrated in FIG. 9. The controller 11 instructs the reflectometer 12 to measure the reflectivity of the thin film 15 by irradiating the thin film 15 being deposited with light of the first wavelength (step S1).

The controller 11 sequentially acquires the reflectivity measured by the reflectometer 12, and the maximum/minimum detection unit 21 in the controller 11 detects the maximum value and the minimum value of the reflectivity measured by the reflectometer 12. Further, the period detection unit 22 in the controller 11 detects the temporal variation period of the reflectivity measured by the reflectometer 12 (step S2).

The refractive index calculation unit 23 in the controller 11 calculates the reflectivity $r_0$ of the electric field at the interface between the air 17 and the thin film 15 on the basis of the above Equations (15) and (16) and calculates the refractive index n of the thin film 15 by substituting the calculation result into Equation (1). Similarly, the refractive index calculation unit 23 calculates the refractive index n of the thin film 15 by substituting another reflectivity $r_0$ calculated on the basis of the above-described Equations (17) and (18) into Equation (1). (Step S3).

As described above, the refractive index calculation unit 23 calculates two refractive indexes n for the first wavelength light with which the reflectometer 12 irradiates the thin film 15.

Next, the controller 11 calculates the variation period T for the two film thicknesses in the thin film 15 by substituting the two refractive indexes calculated in step S3 into Equation (19), respectively, and calculates two growth rates by dividing T by the film formation time (step S4).

Next, the controller 11 instructs the reflectometer 12 to measure the reflectivity of the thin film 15 by irradiating the thin film 15 being deposited with light of the second wavelength (step S5). Thereafter, two growth rates corresponding to the light of the second wavelength are calculated according to the same process procedure as in steps S2 to S4 (steps S6 to S8).

In the above example, the processes of steps S1 to S4 are completed for the first wavelength, and then the processes of steps S5 to S8 are performed for the second wavelength. However, the processes of steps S1 to S4 and the processes in steps S5 to S8 may be performed in parallel. In other words, the thin film 15 is irradiated with the measurement light of the first wavelength and the measurement light of the second wavelength simultaneously, and the reflected light of the two wavelengths may be optically separated. The reflected light intensity for each wavelength may be measured with each detector, and the growth rate may be calculated simultaneously for the first wavelength and the second wavelength.

Next, the growth rate selection unit 25 compares the two growth rates calculated in step S4 with the two growth rates calculated in step S8, selects the growth rate common in both, and determines the growth rate of the thin film 15 (step S9).

Thus, in present embodiment, the reflectometer 12 uses the maximum and minimum values of the reflectivity of the thin film 15 measured with light of two wavelengths (first wavelength and second wavelength) to calculate two refractive indexes of the thin film 15 for each wavelength, and calculates two growth rates of the thin film 15 on the basis of these refractive indexes. Then, a common growth rate is selected between the two growth rates for the first wavelength light and the two growth rates for the second wavelength light and is determined as the growth rate of the thin film 15. Thereby, the growth rate of the thin film 15 can be calculated with high accuracy by an extremely simple method. In the method of calculating the growth rate by fitting the reflectivity function that models the reflectivity to the reflectivity actual measurement curve, the growth rate may not be the actual value unless the initial value is set appropriately. However, in the present embodiment, the fitting process is not performed at all, and thus it is not necessary to set the initial value appropriately. According to the method of the present embodiment, two growth rates per wavelength are always calculated by the above-described Equations (15) to (18). Therefore, the growth rate can be selected easily by comparing with two growth rates at other wavelength.

The above description of the present embodiment is a case where the maximum value, minimum value, and period of the reflectivity associated with the growth of the thin film can be actually measured. However, when the measurement time cannot be sufficiently long, the maximum value, the minimum value, period, or the like of the reflectivity may not be actually measured. Even in such a case, the maximum value, the minimum value, and the period of the reflectivity may be estimated by performing fitting using the model function on the partially measured reflectivity change. The refractive index and growth rate of the thin film may be obtained on the basis of the obtained estimation value of the maximum value, the minimum value, and the period of the reflectivity.

The growth rates obtained in the present embodiment are not necessarily completely matched at different wavelengths due to measurement errors and the like. Finally, a process such as taking an average value is required for the growth rate and refractive index that are slightly different for each measurement wavelength. In some cases, the growth rate and refractive index may be refined by fitting the reflectivity with a model function on the basis of the obtained growth rate and refractive index. This fitting may be performed for one wavelength or for a plurality of wavelengths.

In the growth rate calculation described in the present embodiment, it is necessary to obtain different growth rates at different wavelengths. This means that the refractive index n of the thin film or the refractive index n* of the substrate changes depending on the measurement wavelength. Actually, when the refractive index n of the thin film and the refractive index n* of the substrate do not change with respect to the wavelength, the maximum value $R_+$ and the minimum value $R_-$ of the reflectivity obtained with respect to the change in film thickness do not change. Thus, the refractive index obtained by the calculations described above does not change. In other words, in such a case, the two obtained growth rates do not change depending on the wavelength, and even if the results at different wavelengths are compared, either cannot be selected as the actual value.

Therefore, the plurality of wavelengths for measuring the reflectivity should be selected so that the refractive index n of the thin film or the refractive index n* of the substrate changes to such an extent that the present embodiment can be implemented. Specifically, in two wavelengths, the wavelength is selected such that at least one of the refractive index n of the thin film or the refractive index n* of the substrate changes by 1% or more, more preferably 2% or more, and most preferably 5% or more. In this respect, it is known that a semiconductor having a band gap in a visible portion or in the vicinity of the visible portion has a large change in refractive index in the visible light region, and the semiconductor can be suitably used as the substrate of the present embodiment. A specific example of the material of the substrate suitably used in the present embodiment includes a semiconductor having a band gap of 3.5 eV or less. More specifically, the example includes Group 4 semiconductors such as Si and Ge, Group III-V compound semiconductors such as GaN, GaAs, GaP, and InP, Group II-VI compound semiconductors such as ZnSe, CdTe, ZnS, and CdS, and the mixed crystal thereof.

In this embodiment, the growth in the vapor phase has been described as an example. However, the present embodiment is also effective in a case where the liquid is used as the growth atmosphere. However, in the case of growth in a liquid, the wavelength for measuring the reflectivity is necessarily selected to be transparent in the liquid in the growth atmosphere. When the refractive index of the liquid that is the growth atmosphere changes according to the measurement wavelength, the present embodiment can be used effectively even when the refractive index of the thin film or the substrate does not change much at the wavelength at which the reflectivity is measured. In the calculation equations described so far, it is necessary to use the refractive index of the liquid in the growth atmosphere instead of the refractive index of air.

At least part of the growth rate detection apparatus 20 explained in the embodiment may be configured with hardware or software. When it is configured with software, a program that achieves a function of at least part of the growth rate detection apparatus 20 may be stored in a storage medium such as a flexible disk and CD-ROM, and then installed in a computer to run thereon. The storage medium may not be limited to a detachable storage medium such as a magnetic disk and an optical disk but may be a standalone type storage medium such as a hard disk and a memory.

Moreover, a program that achieves a function of at least part of the growth rate detection apparatus 20 may be distributed via a communication network a (including wireless communication) such as the Internet. The program may also be distributed via a wired network or a wireless network such as the Internet, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A growth rate detection apparatus comprising:
a reflectometer to measure reflectivity of a thin film by receiving reflected light of light irradiated with the thin film formed on a substrate; and
processing circuitry configured to:
calculate a first growth rate and a second growth rate which are candidates for a growth rate of the thin film on a basis of a temporal variation period of the reflectivity and a refractive index of the thin film in a case where the reflectometer irradiates the thin film with light of a first wavelength and to calculate a third growth rate and a fourth growth rate which are candidates for the growth rate of the thin film on a basis of the temporal variation period and the refractive index in a case where the reflectometer irradiates the thin film with light of a second wavelength; and
select a common growth rate in any one of the first growth rate and the second growth rate and any one of the third growth rate and the fourth growth rate as the growth rate of the thin film.

2. The growth rate detection apparatus according to claim 1, wherein the processing circuitry further configured to:
detect a maximum value and a minimum value of the reflectivity measured by the reflectometer;
detect a temporal variation period of the reflectivity measured by the reflectometer; and
calculate the refractive index of the thin film on a basis of a maximum value and a minimum value of the detected reflectivity.

3. The growth rate detection apparatus according to claim 2, wherein the processing circuitry further configured to:
calculate electric field reflectivity at an interface between the thin film and air on the basis of the maximum value and the minimum value of the detected reflectivity, wherein
the processing circuitry calculates the refractive index of the thin film on a basis of the calculated reflectivity of the electric field at the interface between the thin film and air.

4. The growth rate detection apparatus according to claim 3, wherein
the processing circuitry calculates first reflectivity and second reflectivity at the interface between the thin film and air in a case where the reflectometer irradiates the thin film with light of the first wavelength and calculates third reflectivity and fourth reflectivity of the interface between the thin film and air in a case where the reflectometer irradiates the thin film with light of the second wavelength,
the processing circuitry calculates the first refractive index and the second refractive index of the thin film on a basis of the first reflectivity and the second reflectivity and calculates a third refractive index and a fourth refractive index of the thin film on a basis of the third reflectivity and the fourth reflectivity, and
the processing circuitry is configured to calculate the first growth rate and the second growth rate on a basis of the variation period in which the reflectometer irradiates the thin film with light of the first wavelength, and the first refractive index and the second refractive index, and calculates the third growth rate and the fourth growth rate on a basis of the variation period in which the reflectometer irradiates the thin film with light of the second wavelength, and the third refractive index and the fourth refractive index.

5. The growth rate detection apparatus according to claim 3, wherein
the maximum value and the minimum value of the reflectivity detected by the processing circuitry are expressed by an equation capable of mutually replacing an absolute value of the refractive index at the interface between the thin film and the substrate with the reflectivity at the interface between the thin film and the air, and
the processing circuitry, in a case of detecting the maximum value and the minimum value of the reflectivity, is configured to calculate two types for the absolute value of the refractive index at the interface between the thin film and the substrate and the reflectivity at the interface between the thin film and the air by mutually replacing the absolute value of the refractive index at the interface between the thin film and the substrate with the reflectivity at the interface between the thin film and the air.

6. The growth rate detection apparatus according to claim 5, wherein
in a case where the maximum value of the detected reflectivity $R_+$, and the minimum value is $R_-$, the processing circuitry is configured to calculate a reflectivity $r_0$ of the electric field at the interface between the thin film and air on a basis of the following Equation (1), calculates the absolute value $\rho$ of the refractive index of the interface between the thin film and the substrate on a basis of the following Equation (2), calculates the reflectivity $r_0$ at the interface between the thin film and air on a basis of the following Equation (3), and calculates the absolute value $\rho$ of a reflectivity $r_1$ at the interface between the thin film and the substrate on a basis of the following Equation (4)

$$r_0 = \frac{1}{\sqrt{R_+} + \sqrt{R_-}}\{1 + \sqrt{R_+ \cdot R_-} - \sqrt{(1-R_+)(1-R_-)}\} \quad (1)$$

$$\rho = \frac{\sqrt{(1-R_-)} - \sqrt{(1-R_+)}}{\sqrt{R_-(1-R_+)} + \sqrt{R_+(1-R_-)}} \quad (2)$$

$$r_0 = \frac{\sqrt{(1-R_-)} - \sqrt{(1-R_+)}}{\sqrt{R_-(1-R_+)} + \sqrt{R_+(1-R_-)}} \quad (3)$$

$$\rho = \frac{1}{\sqrt{R_+} + \sqrt{R_-}}\{1 + \sqrt{R_+ \cdot R_-} - \sqrt{(1-R_+)(1-R_-)}\}. \quad (4)$$

7. A vapor deposition apparatus comprising:
a reaction chamber to form a thin film on a substrate by vapor phase growth reaction;
a gas supplier to supply gas to the reaction chamber;
a heater to heat the substrate;
a reflectometer to measure reflectivity of the thin film by receiving reflected light of light irradiated with which the thin film formed on the substrate; and
processing circuitry configured to:
calculate a first growth rate and a second growth rate which are candidates for a growth rate of the thin film on a basis of a temporal variation period of the reflectivity and a refractive index of the thin film in a case where the reflectometer irradiates the thin film with light of a first wavelength and calculating a third growth rate and a fourth growth rate which are candidates for the growth rate of the thin film on a basis of the temporal variation period and the refractive index when the reflectometer irradiates the thin film with light of a second wavelength; and select a common growth rate in any one of the first growth rate and the second growth rate and any one of the third growth rate and the fourth growth rate as the growth rate of the thin film.

8. The vapor deposition apparatus according to claim 7, wherein the processing circuitry is further configured to:
detect a maximum value and a minimum value of the reflectivity measured by the reflectometer;
detect a temporal variation period of the reflectivity measured by the reflectometer; and
calculate the refractive index of the thin film on a basis of the maximum value and the minimum value of the detected reflectivity.

9. The vapor deposition apparatus according to claim 8, wherein the processing circuitry is further configured to:
calculate electric field reflectivity at an interface between the thin film and air on the basis of the maximum value and the minimum value of the detected reflectivity, wherein
the processing circuitry is configured to calculate the refractive index of the thin film on a basis of the calculated reflectivity of the electric field at the interface between the thin film and air.

10. The vapor deposition apparatus according to claim 9, wherein
the maximum value and the minimum value of the reflectivity detected by the processing circuitry are expressed by an equation capable of mutually replacing an absolute value of the refractive index at the interface between the thin film and the substrate with the reflectivity at the interface between the thin film and the air, and
the processing circuitry, in a case of detecting the maximum value and the minimum value of the reflectivity, calculates two types for the absolute value of the refractive index at the interface between the thin film and the substrate and the reflectivity at the interface between the thin film and the air by mutually replacing the absolute value of the refractive index at the interface between the thin film and the substrate with the reflectivity at the interface between the thin film and the air.

11. The vapor deposition apparatus according to claim 9, wherein
in a case where the maximum value of the reflectivity detected by the processing circuitry is $R_+$, and the minimum value is $R_-$, the processing circuitry is configured to calculate a reflectivity $r_0$ of the electric field at the interface between the thin film and air on a basis of the following Equation (5), calculates an absolute value $\rho$ of the refractive index of the interface between the thin film and the substrate on a basis of the following Equation (6), calculates the reflectivity $r_0$ at the interface between the thin film and air on a basis of the following Equation (7), and calculates the absolute value $\rho$ of a reflectivity $r_1$ at the interface between the thin film and the substrate on a basis of the following Equation (8)

$$r_0 = \frac{1}{\sqrt{R_+} + \sqrt{R_-}}\{1 + \sqrt{R_+ \cdot R_-} - \sqrt{(1-R_+)(1-R_-)}\} \quad (5)$$

$$\rho = \frac{\sqrt{(1-R_-)} - \sqrt{(1-R_+)}}{\sqrt{R_-(1-R_+)} + \sqrt{R_+(1-R_-)}} \quad (6)$$

$$r_0 = \frac{\sqrt{(1-R_-)} - \sqrt{(1-R_+)}}{\sqrt{R_-(1-R_+)} + \sqrt{R_+(1-R_-)}} \quad (7)$$

$$\rho = \frac{1}{\sqrt{R_+} + \sqrt{R_-}}\{1 + \sqrt{R_+ \cdot R_-} - \sqrt{(1-R_+)(1-R_-)}\}. \quad (8)$$

12. The vapor deposition apparatus according to claim 9, wherein
the processing circuitry is configured to calculate first reflectivity and second reflectivity at the interface between the thin film and air in a case where the reflectometer irradiates the thin film with light of the first wavelength and calculates third reflectivity and fourth reflectivity of the interface between the thin film and air in a case where the reflectometer irradiates the thin film with light of the second wavelength,
the processing circuitry is configured to calculate a first refractive index and a second refractive index of the thin film on a basis of the first reflectivity and the second reflectivity and calculates a third refractive index and a fourth refractive index of the thin film on a basis of the third reflectivity and the fourth reflectivity, and
the processing circuitry is configured to calculate the first growth rate and the second growth rate on a basis of the variation period in which the reflectometer irradiates the thin film with light of the first wavelength, and the first refractive index and the second refractive index, and calculates the third growth rate and the fourth growth rate on a basis of the variation period in which the reflectometer irradiates the thin film with light of the second wavelength, and the third refractive index and the fourth refractive index.

13. A vapor deposition rate detection method comprising:
measuring reflectivity of a thin film by a reflectometer by receiving reflected light of light irradiated with the thin film formed on a substrate;
calculating a first growth rate and a second growth rate which are candidates for a growth rate of the thin film on a basis of a temporal variation period of the reflectivity and a refractive index of the thin film in a case where the reflectometer irradiates the thin film with light of a first wavelength and calculating a third growth rate and a fourth growth rate which are candidates for the growth rate of the thin film on a basis of the temporal variation period and the refractive index in a case where the reflectometer irradiates the thin film with light of a second wavelength; and
selecting a common growth rate in any one of the first growth rate and the second growth rate and any one of the third growth rate and the fourth growth rate as the growth rate of the thin film.

14. The vapor deposition rate detection method according to claim 13, further comprising:
detecting a maximum value and a minimum value of the reflectivity measured by the reflectometer;
detecting a temporal variation period of the reflectivity measured by the reflectometer; and calculating the refractive index of the thin film on a basis of the detected the maximum value and the minimum value of the reflectivity.

15. The vapor deposition rate detection method according to claim 14, further comprising:
calculating reflectivity at an interface between the thin film and air on the basis of the detected maximum value and minimum value of the reflectivity, wherein
the refractive index of the thin film is calculated on a basis of the calculated reflectivity of the electric field at the interface between the thin film and the air.

16. The vapor deposition rate detection method according to claim 15, wherein
the maximum value and the minimum value of the reflectivity detected are expressed by an equation capable of mutually replacing an absolute value of the refractive index at the interface between the thin film and the substrate with the electric field reflectivity at the interface between the thin film and the air, and
in a case where the maximum value and the minimum value of the reflectivity are detected, two types for the absolute value of the refractive index at the interface between the thin film and the substrate and the reflectivity at the interface between the thin film and the air are calculated by mutually replacing the absolute value of the refractive index at the interface between the thin film and the substrate with the reflectivity at the interface between the thin film and the air.

17. The vapor deposition rate detection method according to claim 15, wherein
in a case where the detected maximum value of the reflectivity is $R_+$, and the minimum value is $R_-$, a reflectivity $r_0$ of the electric field at the interface between the thin film and air is calculated on a basis of the following Equation (9), a absolute value $\rho$ of the refractive index of the interface between the thin film and the substrate is calculated on a basis of the following Equation (10), the reflectivity $r_0$ at the interface between the thin film and air is calculated on a basis of the following Equation (11), and the absolute value $\rho$ of a reflectivity $r_1$ at the interface between the thin film and the substrate is calculated on a basis of the following Equation (12)

$$r_0 = \frac{1}{\sqrt{R_+} + \sqrt{R_-}}\{1 + \sqrt{R_+ \cdot R_-} - \sqrt{(1-R_+)(1-R_-)}\} \quad (9)$$

$$\rho = \frac{\sqrt{(1-R_-)} - \sqrt{(1-R_+)}}{\sqrt{R_-(1-R_+)} + \sqrt{R_+(1-R_-)}} \quad (10)$$

$$r_0 = \frac{\sqrt{(1-R_-)} - \sqrt{(1-R_+)}}{\sqrt{R_-(1-R_+)} + \sqrt{R_+(1-R_-)}} \quad (11)$$

$$\rho = \frac{1}{\sqrt{R_+} + \sqrt{R_-}}\{1 + \sqrt{R_+ \cdot R_-} - \sqrt{(1-R_+)(1-R_-)}\}. \quad (12)$$

18. The vapor deposition rate detection method according to claim 15, wherein
first reflectivity and second reflectivity at the interface between the thin film and air are calculated in a case where the reflectometer irradiates the thin film with light of the first wavelength, and third reflectivity and fourth reflectivity of the interface between the thin film and air are calculated in a case where the reflectometer irradiates the thin film with light of the second wavelength,
a first refractive index and a second refractive index of the thin film are calculated on a basis of the first reflectivity and the second reflectivity, and a third refractive index and a fourth refractive index of the thin film are calculated on a basis of the third reflectivity and the fourth reflectivity, and
the first growth rate and the second growth rate are calculated on a basis of the variation period in which the reflectometer irradiates the thin film with light of the first wavelength, and the first refractive index and the second refractive index, and the third growth rate and the fourth growth rate are calculated on a basis of the variation period in which the reflectometer irradiates the thin film with light of the second wavelength, and the third refractive index and the fourth refractive index.

* * * * *